(12) United States Patent
Kwon

(10) Patent No.: US 8,502,566 B2
(45) Date of Patent: Aug. 6, 2013

(54) ADJUSTABLE INPUT RECEIVER FOR LOW POWER HIGH SPEED INTERFACE

(75) Inventor: Chang Ki Kwon, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 195 days.

(21) Appl. No.: 12/125,760

(22) Filed: May 22, 2008

(65) Prior Publication Data

US 2009/0051391 A1    Feb. 26, 2009

Related U.S. Application Data

(60) Provisional application No. 60/941,228, filed on May 31, 2007.

(51) Int. Cl.
  *H03K 5/24* (2006.01)
(52) U.S. Cl.
  USPC ............................................. 327/68; 326/83
(58) Field of Classification Search
  USPC ............... 326/80–87, 17, 68, 112, 115, 127, 326/119, 121; 327/153, 108, 109
  See application file for complete search history.

(56) References Cited

U.S. PATENT DOCUMENTS

| | | | | |
|---|---|---|---|---|
| 5,461,330 A * | 10/1995 | Gist et al. | | 326/17 |
| 5,687,330 A | 11/1997 | Gist et al. | | |
| 5,831,472 A * | 11/1998 | Wang et al. | | 327/543 |
| 6,169,424 B1 * | 1/2001 | Kurd | | 327/53 |
| 6,172,524 B1 * | 1/2001 | Cho | | 326/70 |
| 6,392,453 B1 * | 5/2002 | Morzano et al. | | 327/108 |
| 7,218,151 B1 | 5/2007 | Kursun et al. | | |
| 7,279,934 B2 * | 10/2007 | Do | | 326/83 |

FOREIGN PATENT DOCUMENTS

| | | |
|---|---|---|
| DE | 4127212 A1 | 2/1993 |
| GB | 2340682 | 2/2000 |
| GB | 2340682 A * | 2/2000 |
| JP | 2005027392 A | 1/2005 |
| JP | 2006060689 | 3/2006 |

OTHER PUBLICATIONS

Kursun Vet Al: "Variable threshold voltage keeper for contention reduction in dynamic circuits" ASIC/SOC Conference, 2002. 15th Annual IEEE International Sep. 25-28, 2002, Piscataway, NJ, USA,IEEE, Sep. 25, 2002, pp. 314-318 XP010622047 ISBN:978-0-7803-7494-2.*

(Continued)

*Primary Examiner* — Crystal L Hammond
(74) *Attorney, Agent, or Firm* — Ramin Mobarhan

(57) ABSTRACT

A pseudo-differential input receiver is disclosed which is configured to support a wide-range of reference voltage Vref and a wide-range frequency interface with no parallel termination are described herein. The pseudo-differential receiver implementations described herein are very efficient in terms of area, power, and performance. A wide-frequency-range Vref-adjustable input receiver is described herein. The receiver can be configured with a Vref-monitoring PMOS helper FET or an enabled stacked PMOS helper FET to enable the receiver to work at Vref=0V like a conventional CMOS receiver. The receiver can also be configured with a Vref-monitoring NMOS helper FET to enable a Vref-based input receiver to work with programmability on bias currents & trip-point at Vref=(0.5~0.7)Vdd, depending on the ratio of output driver's impedance and parallel on/off-die termination impedance.

28 Claims, 19 Drawing Sheets

OTHER PUBLICATIONS

Kursun Vet Al: "Variable threshold voltage keeper for contention reduction in dynamic circuits" ASIC/SOC Conference, 2002. 15th Annual IEEE International Sep. 25-28, 2002, Piscataway, N J, USA,IEEE, Sep. 25, 2002, pp. 314-318 XP010622047 ISBN:978-0-7803-7494-2.*

International Search Report and Written Opinion—PCT/US2008/064968, International Search Authority—European Patent Office—Aug. 28, 2008.

Kursun V et al: "Variable threshold voltage keeper for contention reduction in dynamic circuits" ASIC/ SOC Conference, 2002. 15th Annual IEEE International Sep. 25-28, 2002, Piscataway, NJ, USA,IEEE, Sep. 25, 2002, pp. 314-318.

Bazes M., "Two Novel Fully Complementary Self-Biased CMOS Differential Amplifiers", IEEE Journal of Solid-State Circuits, vol. 26, No. 2, 1991, pp. 165-168.

Dally, J.W. et al., "Digital Systems Engineering", The Press Syndicate of The University of Cambridge, 1998, pp. 543-544.

* cited by examiner

ADJUSTABLE INPUT RECEIVER FOR LOW POWER HIGH SPEED INTERFACE

CROSS-REFERENCES TO RELATED APPLICATIONS

This application claims the benefit of U.S. Provisional Application No. 60/941,228, filed May 31, 2007, entitled ADJUSTABLE INPUT RECEIVER FOR LOW POWER HIGH SPEED INTERFACE, the entirety of which is hereby incorporated by reference herein.

BACKGROUND

1. Field of the Invention

The invention relates to the field of integrated semiconductor circuits. More particularly, the invention relates to the field of high speed input logic receivers such as Complementary Metal Oxide Semiconductor (CMOS) input receivers or pseudo-differential input receivers.

2. Description of Related Art

Generally, a conventional CMOS input receiver, such as those that do not support an additional reference voltage, Vref, as shown in FIG. 1 using thick devices or using thin devices, works well below 200 MHz for low power memory interface such as those defined in External Bus Interface standards EBI1, EBI2, and the like. For higher frequency operation, such as from 200 MHz to 533 MHz, several kinds of Vref-based single-ended pseudo-differential input receiver as shown in FIG. 2 have been used with different Vref values, such as one-half the supply voltage without parallel termination or 70% supply voltage with a Vddq-termination. To cover wide-range frequency and support for Vref, such as required for receiver implementations in support of a low power Double Data Rate (DDR2) interface, a simple solution is to configure multiple parallel input receivers and to turn on only one receiver based on the Vref value. This approach, however, is not desirable in terms of area and power. Additionally, the multiple parallel receiver implementation suffers from performance degradation that can be attributable to the increased input capacitance, Cin, and the increased input-path delay due to the added mux.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

It is desirable to have only one configuration of a wide-frequency-range Vref-adjustable input receiver. The receiver configuration can be made to operate over a wide frequency range and over a wide range of Vref values. The performance of the receiver can be easily adjusted with changes that only have minimal effects on die area and power consumption.

Figure 1:
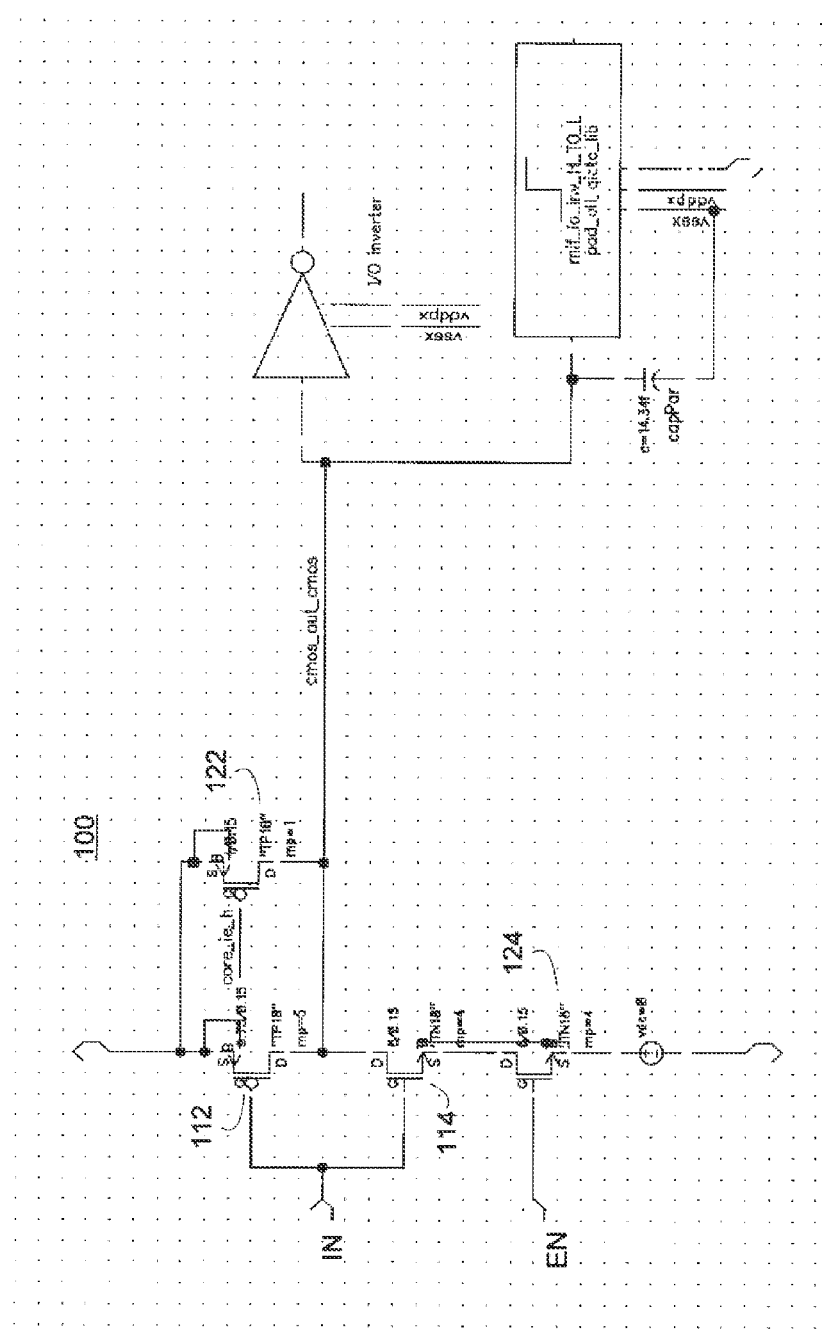
FIG. 1 is a simplified schematic diagram of an exemplary embodiment of a CMOS receiver without support for Vref.

FIG. 1 is a simplified schematic diagram of an exemplary embodiment of a conventional CMOS receiver 100 without Vref. The conventional CMOS receiver 100 of FIG. 1 can be implemented using conventional thick devices or thin devices.

The conventional CMOS receiver 100 includes a conventional complementary FET pair configured as a CMOS inverter that includes a PMOS FET 112 stacked on an NMOS FET 114. The source of the PMOS FET 112 is coupled to Vdd and the drain is common with the drain of the NMOS FET 114, which operates as the output of the CMOS inverter. The gate of the PMOS FET 112 is common with the gate of the NMOS FET 114 and serves as the input to the CMOS receiver 100.

The source of the NMOS FET 114 can be coupled to Vss or optionally to the drain connection of an NMOS enable FET 124. The source of the NMOS enable FET 124 is coupled to Vss and the gate receives an enable control signal. Similarly, a PMOS enable FET 122 can be configured to pull up the output of the CMOS inverter when the inverter is not enabled. The source of the PMOS enable FET 122 is coupled to Vdd and the drain is coupled to the output of the CMOS inverter. The gate of the PMOS enable FET 122 is configured to receive the enable control signal.

The conventional CMOS receiver 100 of FIG. 1 does not support a Vref input. The inability to support a variable Vref value makes the conventional CMOS receiver 100 less desirable for operation at higher frequencies with small swing input aligned to Vref-level. The Vref value can be considered the nominal logic threshold, and the logic transitions from low-high or high-low are often specified in terms of a Vref value when the receiver supports Vref. Support for an externally controllable Vref value may be desirable in order to compensate or otherwise interface with a bus or device that may not operate at precisely the same supply voltage used by the CMOS receiver 100 or to otherwise compensate for effects of an electrical bus or interface. Indeed, some memory interface standards expressly set forth a range of values for Vref.

Figure 2:
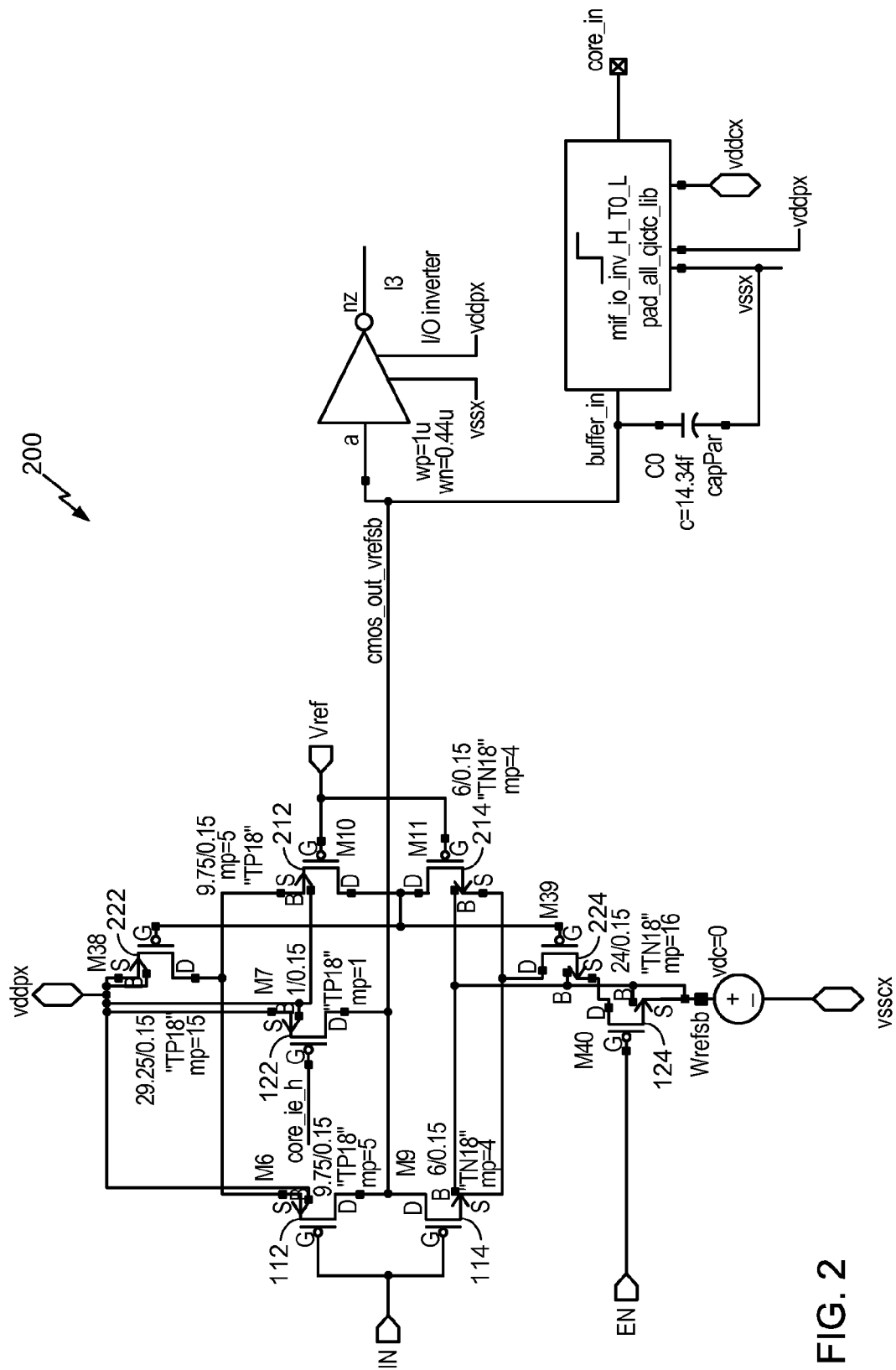
FIG. 2 is a simplified schematic diagram of an exemplary embodiment of a pseudo-differential receiver with support for Vref.

The exemplary pseudo-differential receiver 200 embodiment of FIG. 2 includes provisions for accepting a Vref value. The exemplary pseudo-differential receiver 200 embodiment of FIG. 2 can be based on the same CMOS inverter described in the exemplary embodiment of FIG. 1. A PMOS FET 112 is stacked on an NMOS FET 114, and the two FETs share a common gate connection as the inverter input.

A Vref CMOS pair is positioned substantially in parallel to the CMOS inverter. The parallel configuration refers to begin connected electrically in parallel, such that the input current connections for the Vref CMOS pair and the CMOS inverter are common as are the output current connections.

A Vref value drives the input to the Vref CMOS pair. The Vref value is typically received from an external interface to an integrated circuit, although the Vref value may also be generated internal to an integrated circuit. Typically, the Vref value represents a logic threshold, setpoint, or trip point. The value of the logic threshold may be adjusted to accommodate interfacing with various devices that may not operate on the same voltage supply as the input receiver. The Vref CMOS pair includes a PMOS Vref FET 212 stacked on an NMOS Vref FET 214. The PMOS Vref FET 212 and NMOS Vref FET 214 have common gate connections, which are configured to receive the reference voltage, Vref.

The source connection of the PMOS Vref FET 212 is common with the source of the PMOS FET 112 of the CMOS inverter. The common source connections are coupled to the drain of a pull up PMOS FET 222. The source of the pull up PMOS FET 222 is coupled to Vdd, while the gate is coupled to the common drain connections of the Vref CMOS pair.

The source connection of the NMOS Vref FET 214 is common with the source of the NMOS FET 114 of the CMOS inverter. A pull down NMOS FET 224 has a drain connected to the common source connections and has a source connected to Vss or optionally to the drain of the NMOS enable FET 124. The gate of the pull down NMOS FET 224 is coupled to the common drain connection of the Vref CMOS pair.

The Vref CMOS pair in combination with the pull up PMOS FET 222 and the pull down NMOS FET 224 operates to control the logic threshold or trip point of the CMOS inverter, and controls the bias current through the CMOS inverter based on the relationship of the input voltage to the Vref value. However, the conventional Vref-based pseudo-differential receiver 200 can not always be well-biased to meet high performance operation over a wide-range of Vref, particularly when Vref is close to Vss or Vdd.

The conventional approach for addressing a range of Vref values is to produce a number of input receivers in parallel and to select the input receiver based on the Vref operating value. Configuring multiple input receivers in parallel and selecting one of the input receivers based on the value of Vref is an inefficient manner of providing support for wide input frequency range and Vref range. The CMOS input receivers and methods disclosed herein implement a more efficient solution that utilizes a single input receiver implementation that is configurable to support a wide range of input frequencies and a wide range of Vref values.

Figure 3:
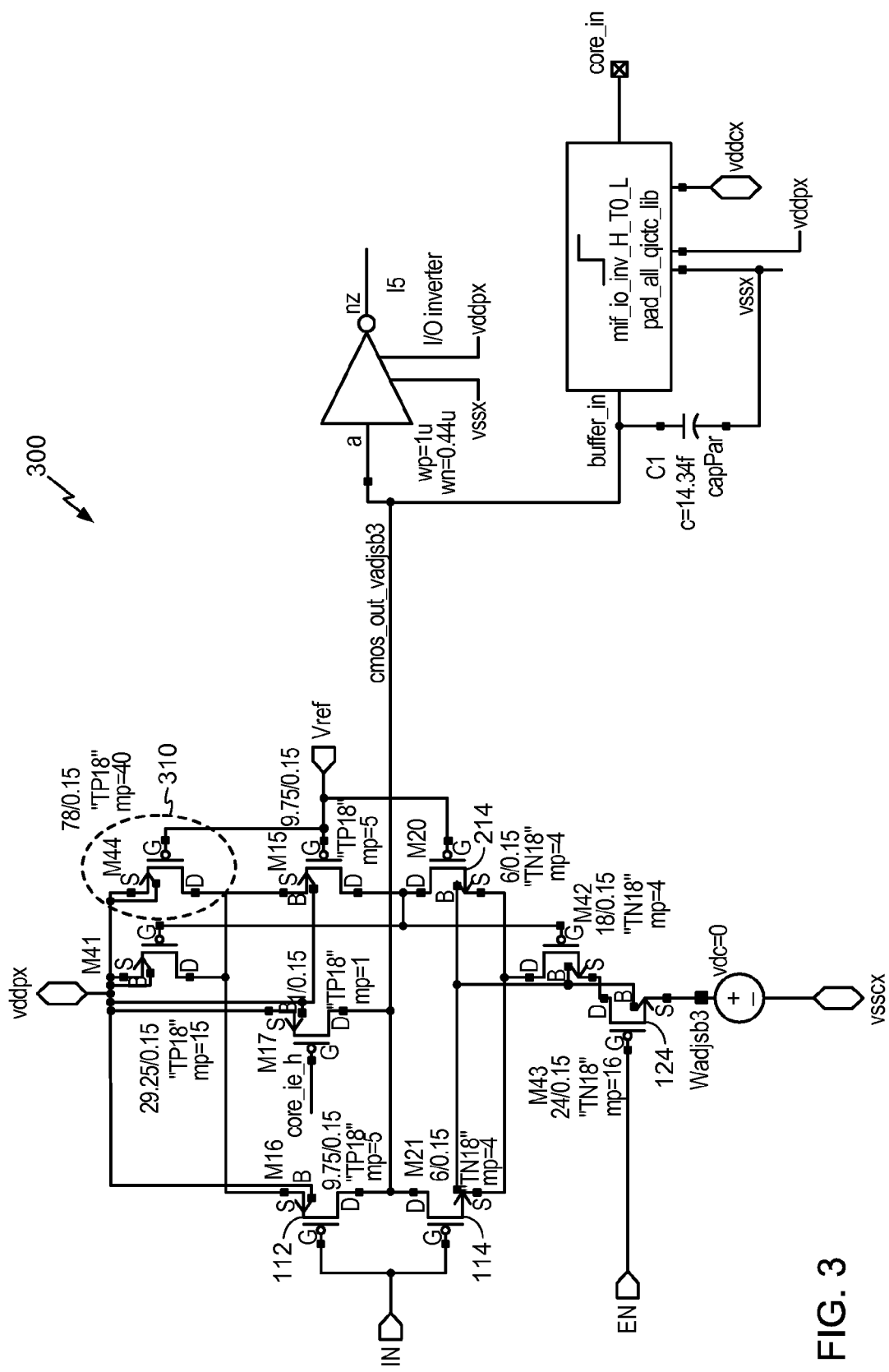
FIG. 3 is a simplified schematic diagram of an exemplary embodiment of a Vref adjustable self biased pseudo-differential receiver.

FIG. 3 is a simplified schematic diagram of a Vref adjustable self biased pseudo-differential input receiver 300. The self biased pseudo-differential input receiver 300 includes provisions for accepting a Vref value to a CMOS pair that is in parallel to the active CMOS logic pair of the CMOS receiver 300. However, unlike the Vref based pseudo-differential receiver exemplary embodiment of FIG. 2, the self biased pseudo-differential receiver 300 further includes a helper PMOS FET 310, alternatively configured as an enabled stacked PMOS helper, that pulls up the source of the PMOS FET 302 in the active CMOS pair. The helper PMOS FET 310 has its source coupled to Vdd and its drain coupled to the source of the PMOS FET 112 in the active CMOS logic pair, which is also common to the source of the Vref PMOS FET 212. Thus, the self biased pseudo-differential input receiver 300 can be configured substantially identical to the CMOS receiver exemplary embodiment of FIG. 2 with the addition of the helper PMOS FET 310, which can be referred to in the alternative as a current helper FET or Ibias helper FET.

The source of the helper PMOS FET 310 is coupled to Vdd and its drain coupled to the source of the PMOS FET 112 in the CMOS logic pair. The gate of the helper PMOS FET 310 receives the Vref value. Thus, the helper PMOS FET 310 effectively monitors the Vref line and provides a path for Ibias current for the CMOS inverter. The addition of the helper PMOS FET 310 permits the pseudo-differential receiver 300 to operate substantially as a conventional CMOS receiver when Vref is at or near zero volts. Also, the CMOS receiver 300 exemplary embodiment of FIG. 3 exhibits performance that is better than that of the conventional CMOS receiver of FIG. 1, because the CMOS receiver 300 of FIG. 3 can operate with non-zero Vref values.

The addition of the PMOS FET 310 to a Vref-enabled pseudo-differential receiver permits the pseudo-differential receiver 300 to perform comparable to a Vref-enabled pseudo-differential receiver, such as the receiver exemplary embodiment of FIG. 2, under conditions where Vref is approximately 0.5 Vdd. Thus, the pseudo-differential receiver 300 configuration of FIG. 3 can operate over a range of Vref of approximately from Vss to 50% Vdd.

Figure 4:
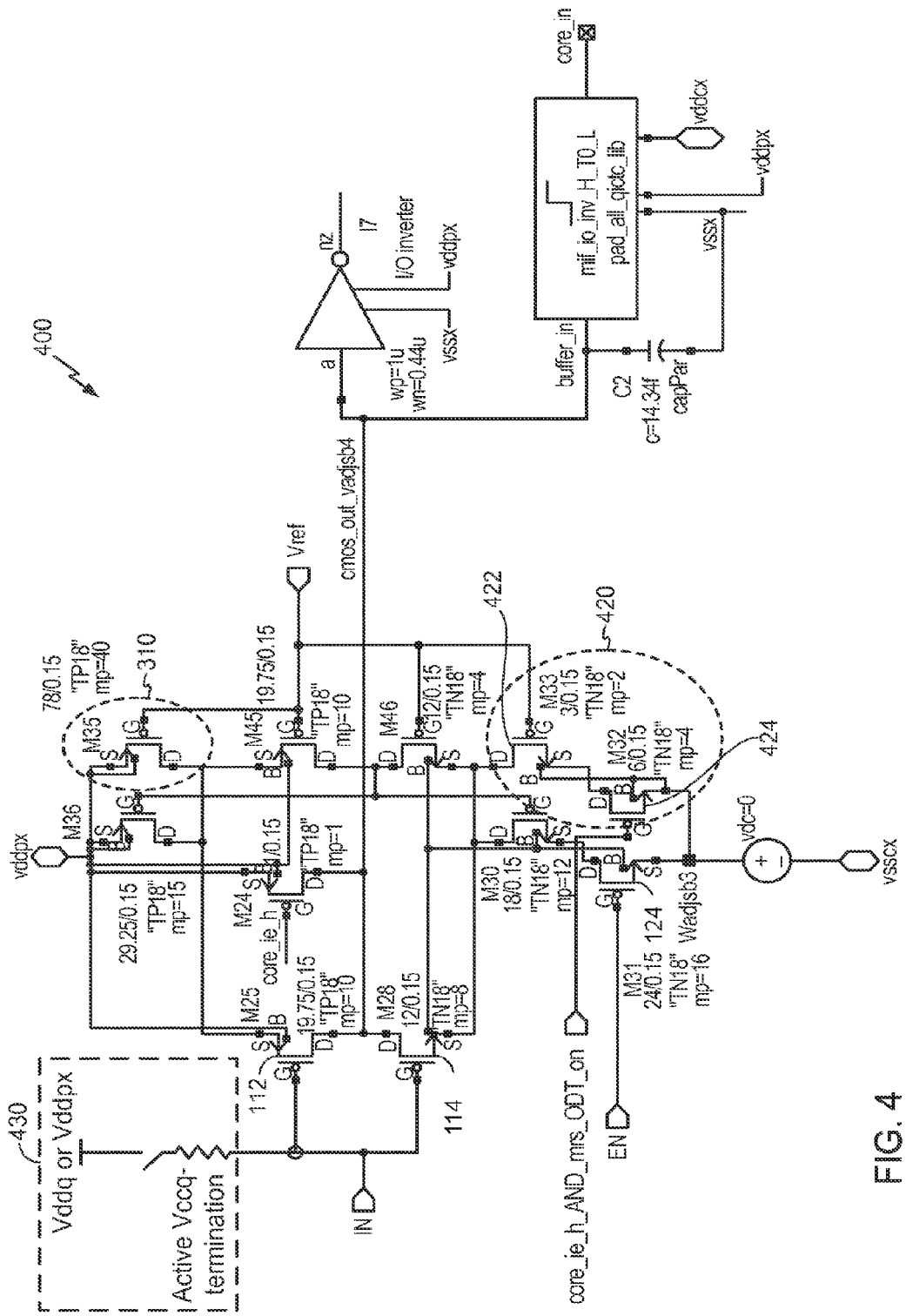
FIG. 4 is a simplified schematic diagram of an exemplary embodiment of a Vref adjustable self biased pseudo-differential receiver.

FIG. 4 illustrates another exemplary embodiment of a pseudo-differential input receiver 400. The input receiver exemplary embodiment of FIG. 4, as well as the exemplary embodiments illustrated in other figures, may be configured using thick devices as well as thin devices. The pseudo-differential receiver 400 exemplary embodiment of FIG. 4 is configured similar to the pseudo-differential input receiver exemplary embodiment illustrated in FIG. 3. The pseudo-differential input receiver 400 includes the helper PMOS FET 310 as illustrated in the exemplary embodiment of FIG. 3, and also includes an NMOS helper configuration 420.

The NMOS helper configuration 420 permits Vref-based CMOS receiver 400 to work with programmability on bias currents and trip-point over a range of Vref=(0.5~0.7)Vdd. Thus, when the NMOS helper configuration 420 is used in combination with the helper PMOS FET 310, the CMOS receiver 400 can operate over a range Vref values spanning approximately from Vss to 70% Vdd.

The NMOS helper configuration 420 includes a stacked configuration of two NMOS FETs 422 and 424. A helper NMOS FET 422 is implemented in a stacked configuration with an enable NMOS FET 424. In the stacked configuration, the source of the helper NMOS FET 422 is connected to the drain of the enable NMOS FET 424 in a series connection, such that current flow through the helper NMOS FET 422 is inhibited when the enable NMOS FET 424 is switched off.

The gate of the enable NMOS FET 424 is configured to receive an enable control signal, such as an interface enable control signal. The gate of the helper NMOS FET 422 is configured to receive the Vref value and thus operates to further regulate the current through the CMOS inverter based in part on the value of the Vref voltage.

The pseudo-differential input receiver 400 also may include an active input termination 430. The performance of the CMOS receiver 400 may be adjusted based on a ratio of the output driver's impedance to parallel on/off-die termination impedance. Although the input of the receiver 400 exemplary embodiment of FIG. 4 is illustrated as having an active Vccq termination 430 at the input to the CMOS receiver 400, such a termination is not always needed, and the termination may be omitted in other configurations.

Figure 5A:
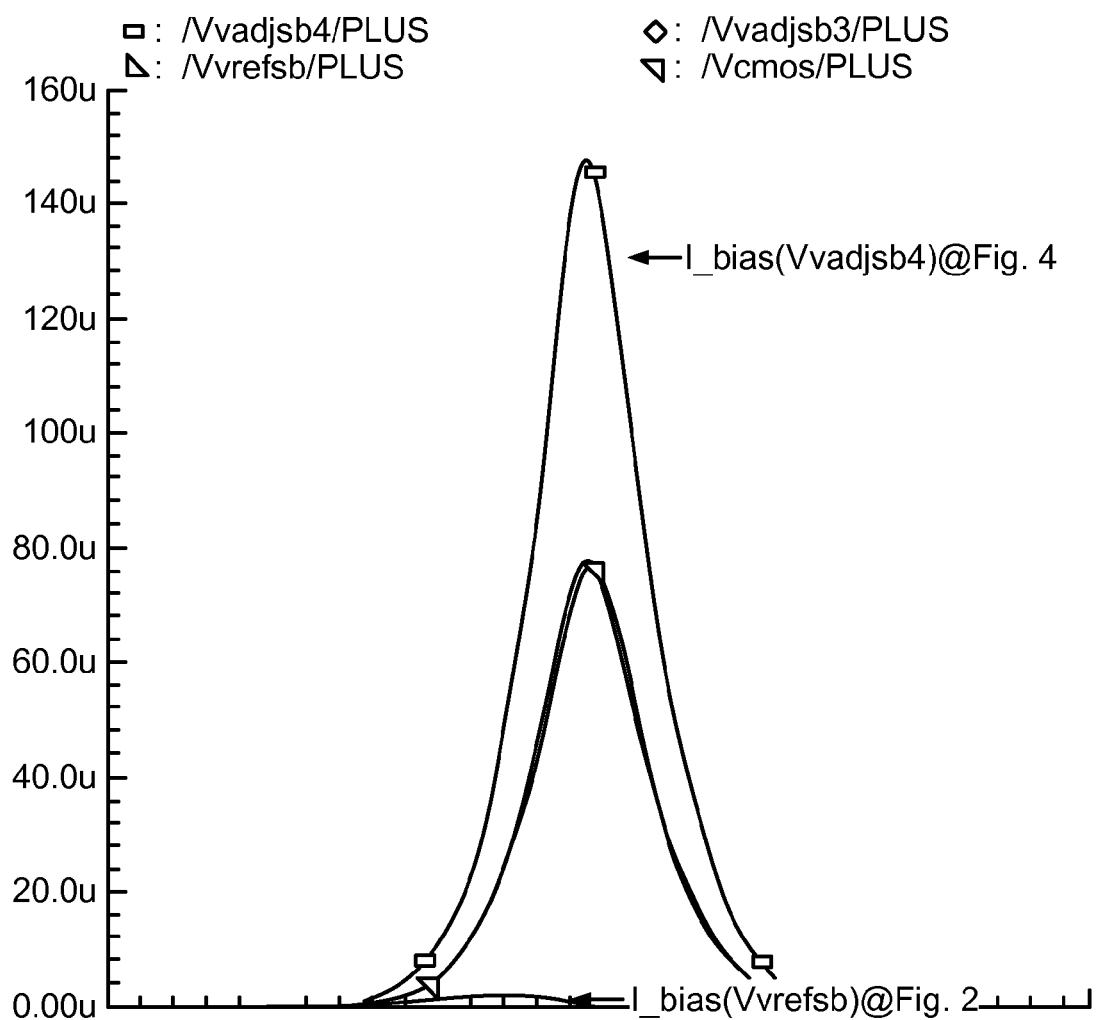
FIGS. 5a-5f are simplified diagrams of performance curves comparing various exemplary receiver embodiments.

FIGS. 5a-5f are simplified diagrams of performance curves comparing various receiver exemplary embodiments. FIG. 5a illustrates bias currents with respect to Vin for the receiver exemplary embodiments illustrated in FIGS. 1-4 when Vref is set to 0V. Because the Vref value is set to 0 volts, the bias current in the exemplary embodiment of FIG. 2 is substantially limited.

Figure 5B:
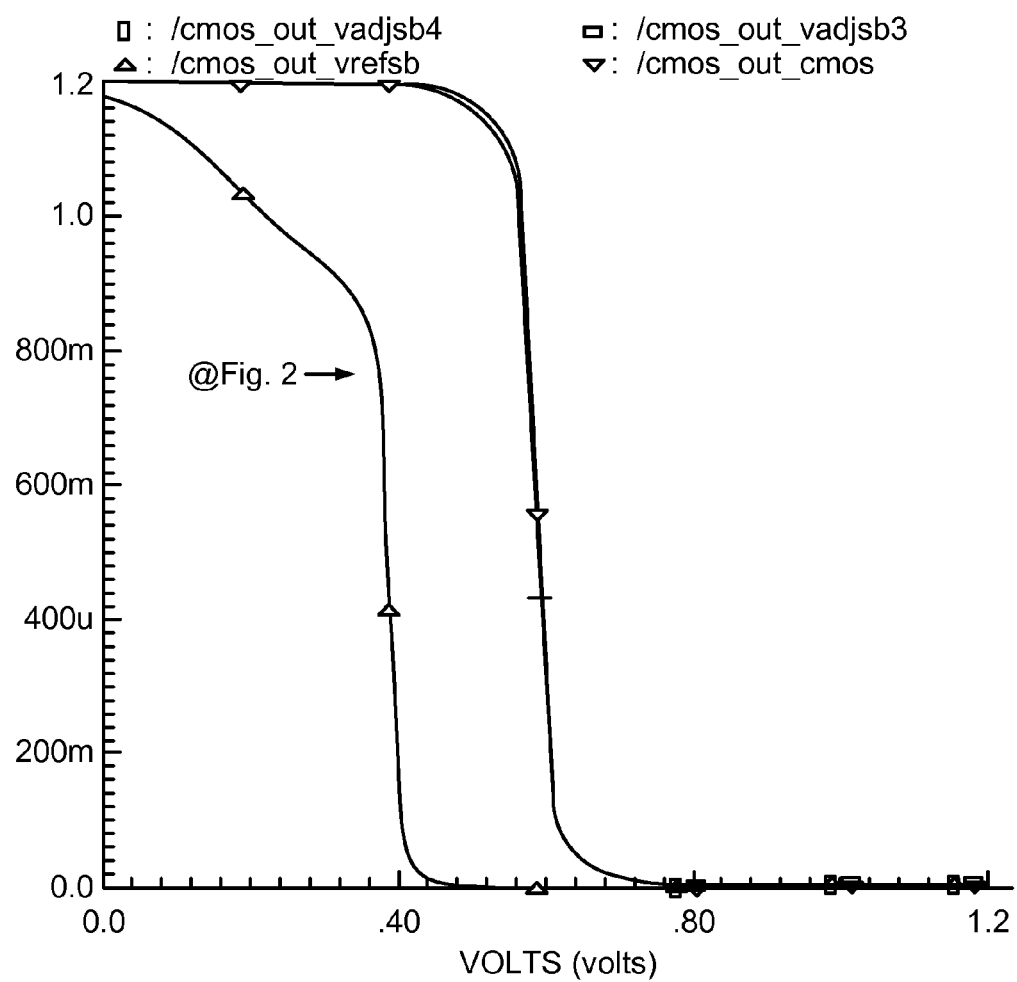

FIG. 5b illustrates the corresponding voltage transfer function of Vout with respect to Vin for the receiver exemplary embodiments with Vref set to 0V. As can be seen from the voltage transfer function of FIG. 5b, the conventional Vref enabled pseudo-differential receiver 200 exemplary embodiment of FIG. 2 performs poorly when the Vref value is near zero.

Figure 5C:
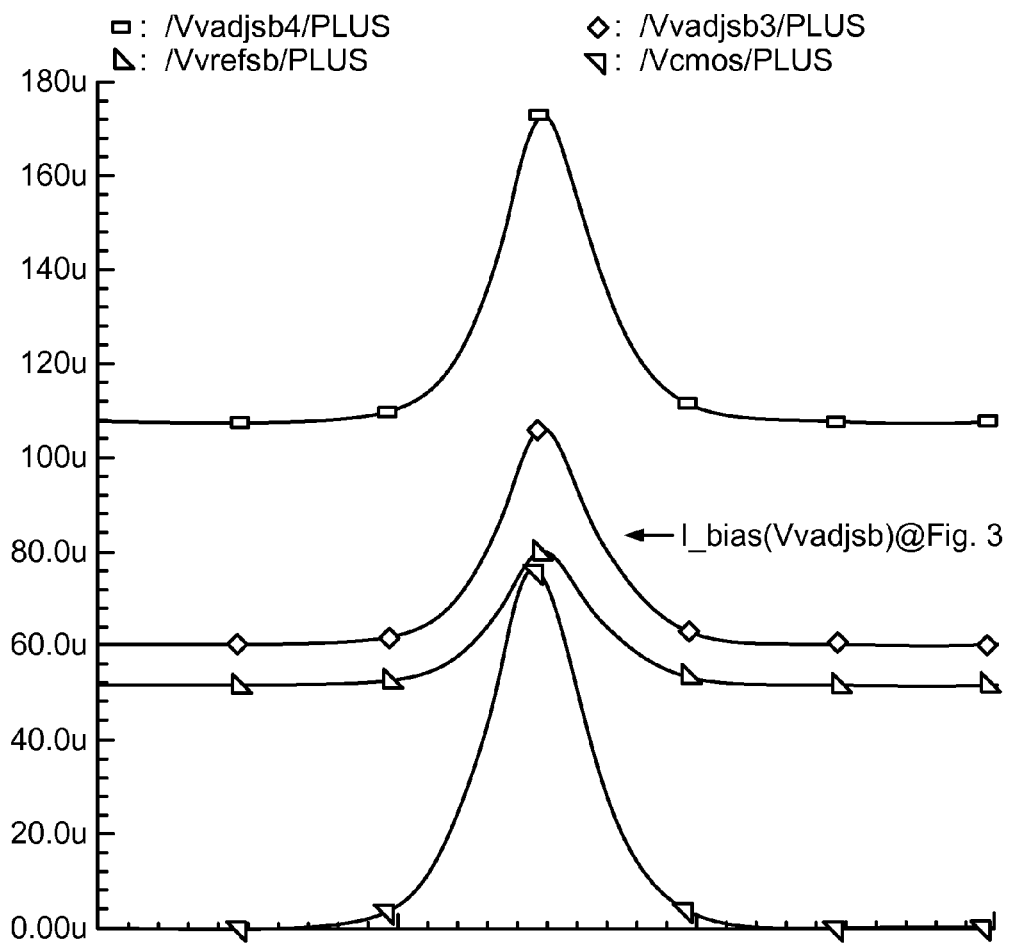

FIG. 5c illustrates bias currents with respect to Vin for the receiver exemplary embodiments illustrated in FIGS. 1-4 when Vref is set to approximately one-half the Vdd value for those exemplary embodiments supporting a Vref value. As can be seen, the addition of the helper FETs increase the amount of current that steady state bias current flowing through the input receiver.

Figure 5D:
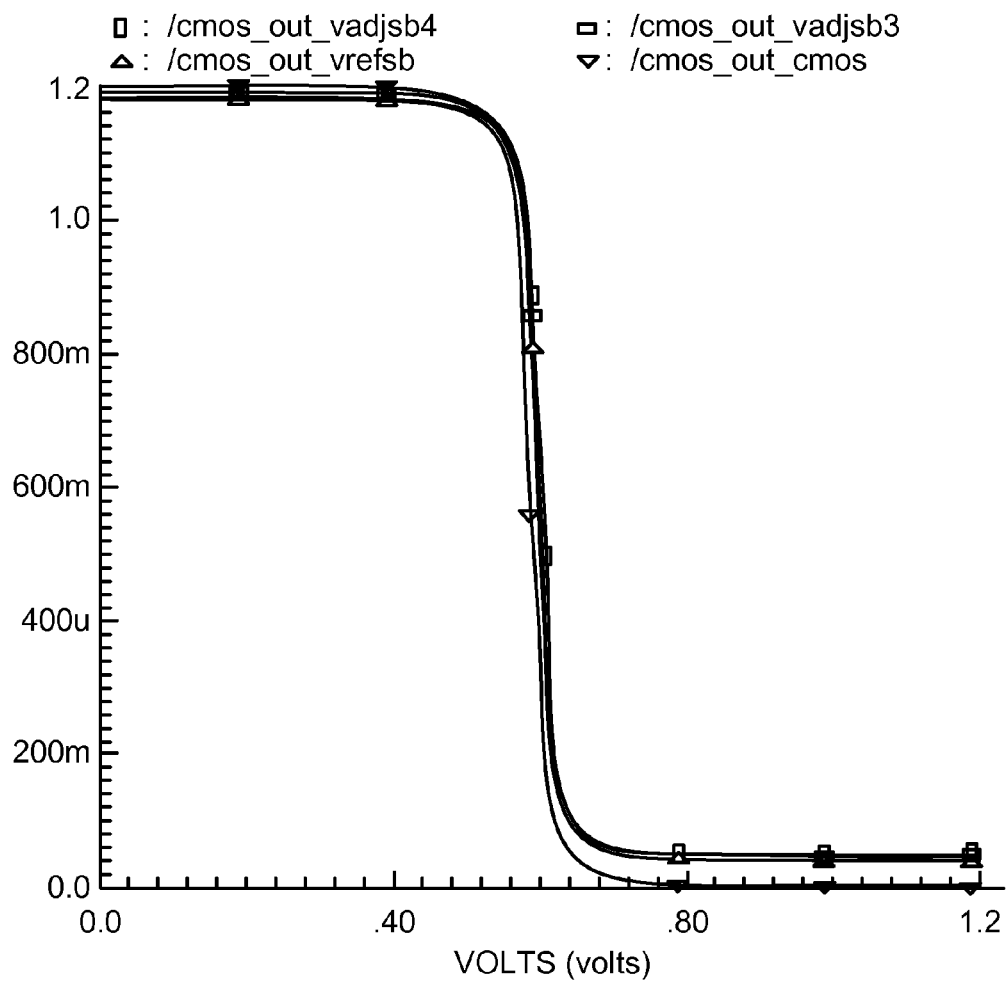

FIG. 5d illustrates the corresponding voltage transfer function of Vout with respect to Vin for the receiver exemplary embodiments with Vref=(0.5)Vdd. The receivers forming the basis of the performance curves of FIGS. 5a-5f utilize a Vdd of 1.2V. Thus, the Vref value in FIGS. 5b and 5c correspond to approximately 0.6V. Because this logic threshold represents substantially a standard configuration, each of the exemplary embodiments performs satisfactorily, as one would assume.

Figure 5E:
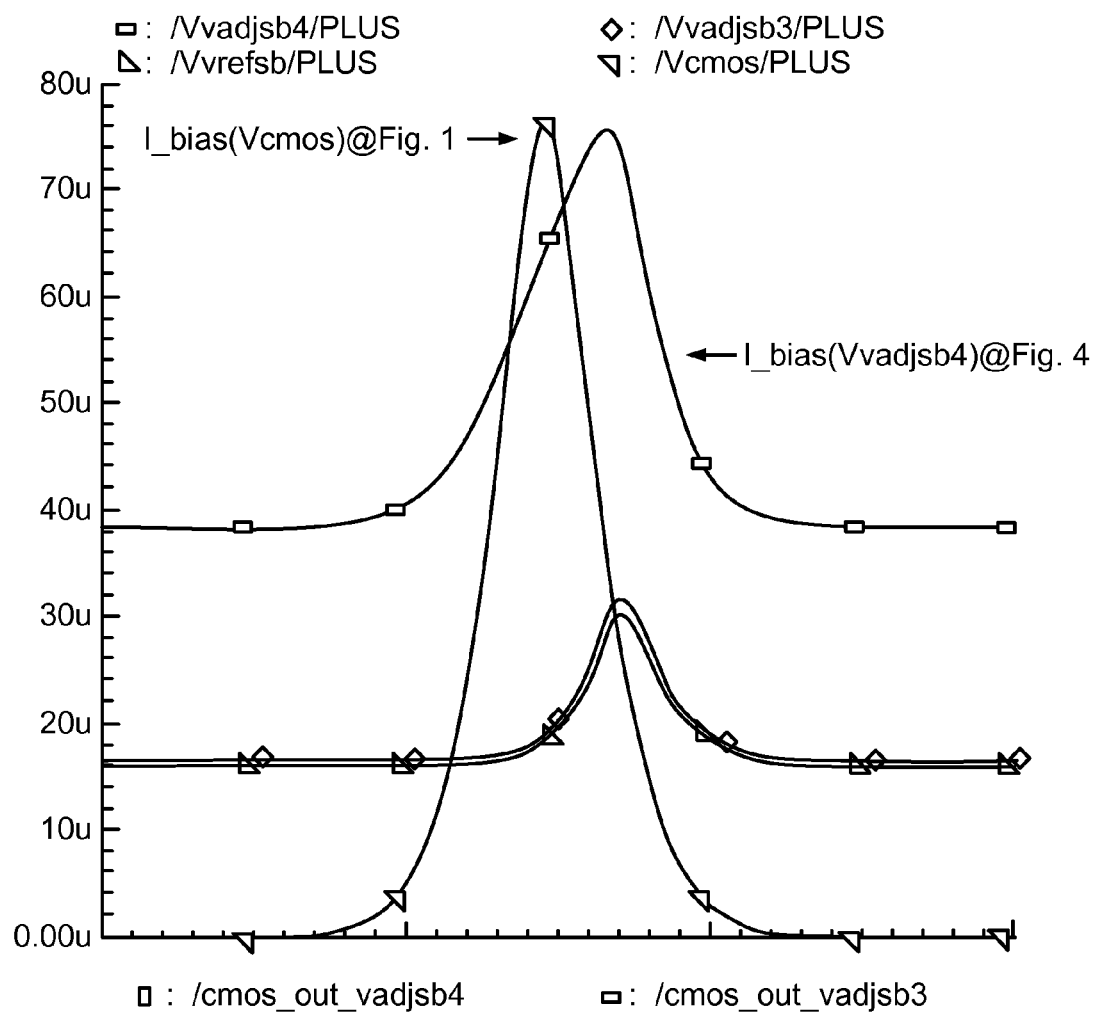

FIG. 5e illustrates bias currents with respect to Vin for the receiver exemplary embodiments illustrated in FIGS. 1-4 when Vref is set to greater than one-half the Vdd value for those exemplary embodiments supporting a Vref value.

Figure 5F:
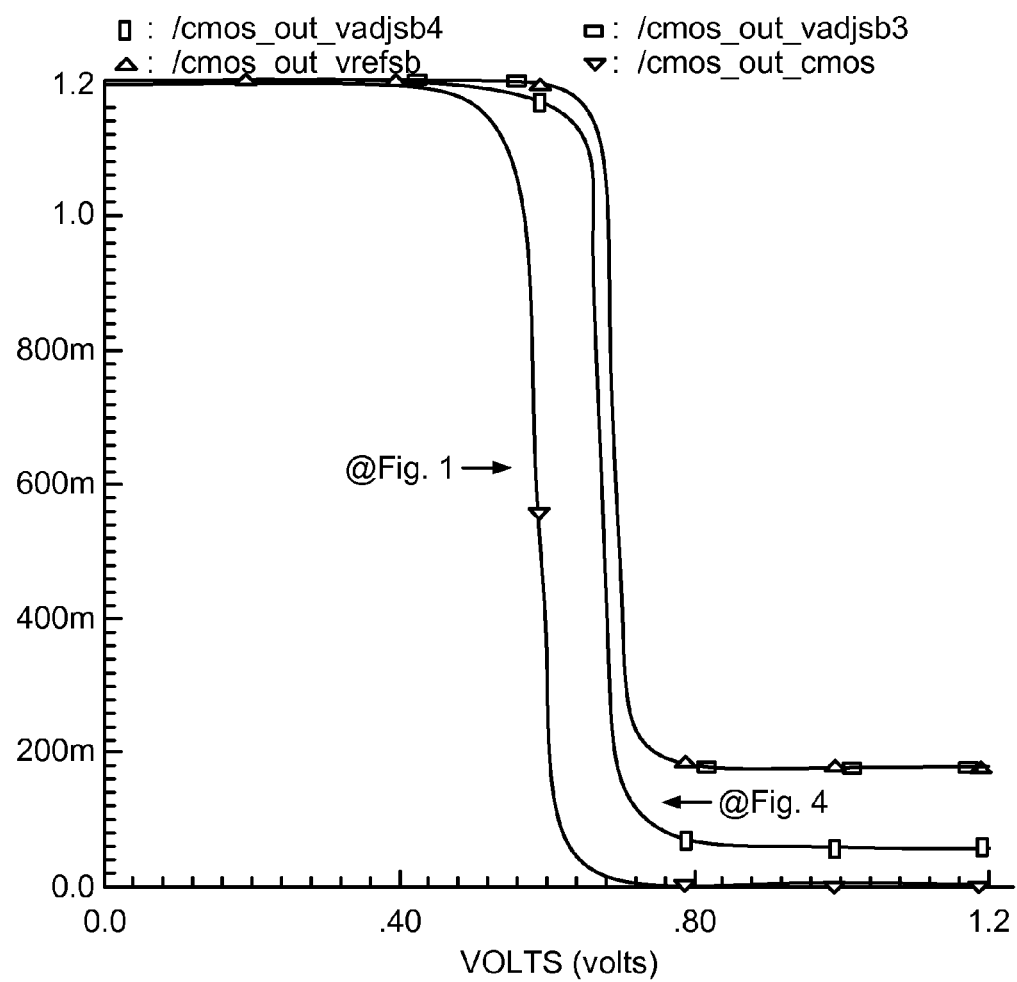

FIG. 5f illustrates the corresponding voltage transfer function of Vout with respect to Vin for the receiver exemplary embodiments with Vref=0.7V, corresponding to approximately 0.58 Vdd. This level of Vref may be greater than is conventionally supported by a conventional input receiver, even one that accepts a Vref input.

As can be seen by the performance curves of FIGS. 5e and 5f, the CMOS receiver exemplary embodiment of FIG. 1, which does not support a Vref value, fails to enable adjusting the setpoint or logic threshold of the voltage transfer function. The CMOS input exemplary receiver embodiments of FIGS. 2-4 closely tracks the increase in the Vref value. However, as can be seen in the voltage transfer function curves of FIG. 5f, the exemplary pseudo-differential input receiver embodiments of FIGS. 2 and 3 can support the increased Vref value, but do not pull down near ground when outputting the low logic state. The CMOS input receiver of FIG. 4 having the helper NMOS configuration enables the output voltage to pull nearer to zero volts when the input is high.

Figure 6:
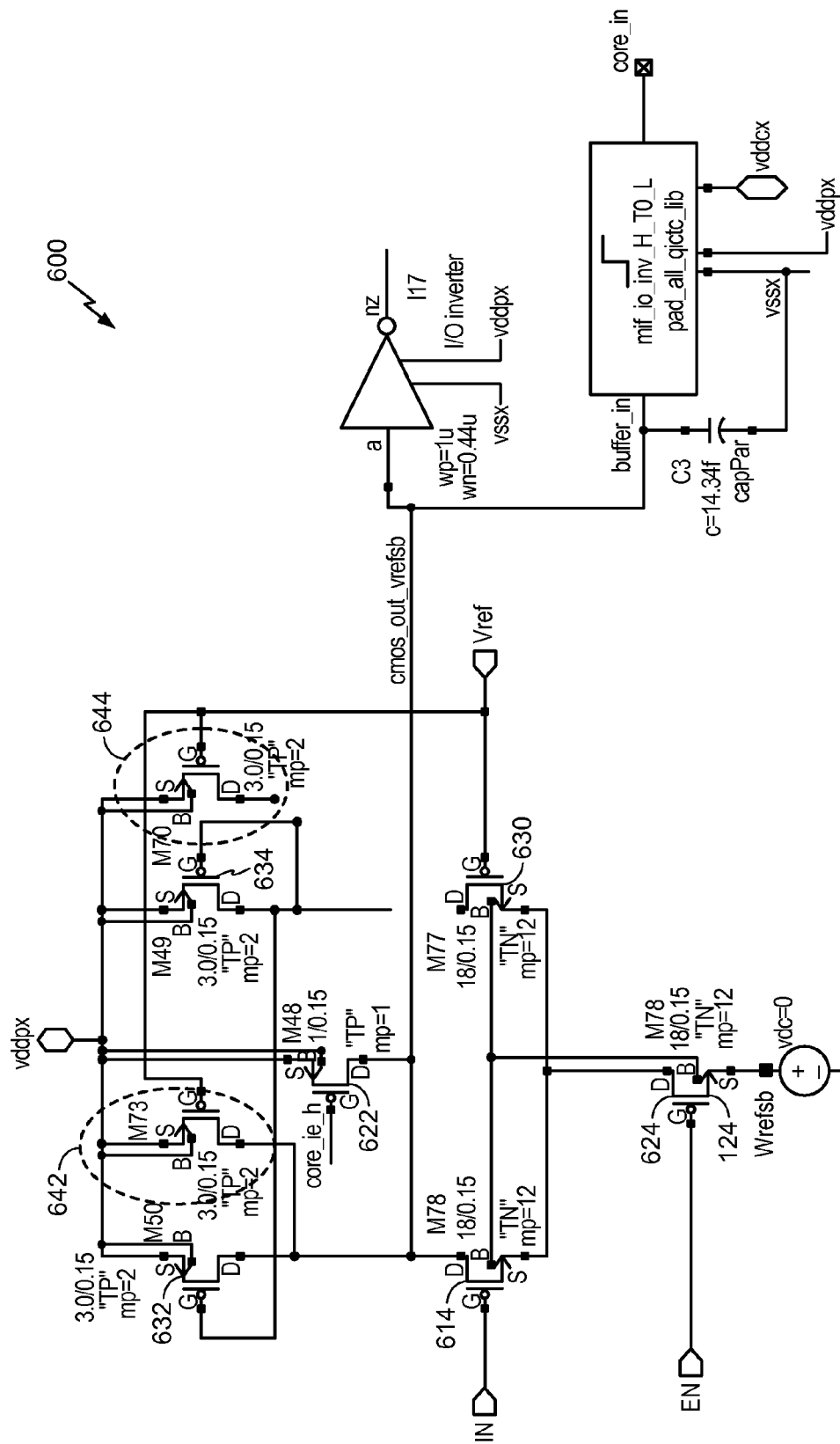
FIG. 6 is a simplified schematic diagram of an exemplary embodiment of a Vref adjustable self biased NMOS pseudo-differential receiver.

The Vref improvements are not limited to use with a pseudo-differential input receiver, but may be applicable to other input receivers based on other configurations. FIG. 6 is a simplified schematic diagram of an exemplary embodiment of a Vref adjustable NMOS receiver 600.

A first NMOS FET 614 is configured as the logic gate. The gate of the first NMOS FET 614 is configured to receive the input voltage. The source of the first NMOS FET 614 is coupled to the drain of an enable NMOS FET 624. The source of the enable NMOS FET 624 is coupled to Vss or ground, and the gate of the enable NMOS FET 624 is configured to receive an active high enable signal.

The drain of the first NMOS FET 614 represents the logic output from the input receiver 600. The drain of the first NMOS FET 614 is coupled to the drain of an enable PMOS FET 622 that operates to pull up the output voltage when the input receiver is not enabled. The source of the enable PMOS FET 622 is coupled to Vdd, while its gate receives the active high enable signal.

The configuration of devices implemented to support the Vref input include a second NMOS FET 630 configured as a Vref NMOS FET. The gate of the second NMOS FET 630 receives the Vref signal, while the source of the second NMOS FET 630 is common with the source of the first NMOS FET 614. The drain of the second NMOS FET 630 is coupled to the gate connections of two separate pull-up FETs.

A first PMOS pull up FET 632 has its source coupled to Vdd, a gate coupled to the drain of the second NMOS FET 630, and a drain coupled to the drain of the first NMOS FET 614. A second PMOS pull up FET 634 has its source coupled to Vdd, and both its gate and drain connections coupled to the drain of the second NMOS FET 630.

The input receiver 600 includes a helper FET configuration including two helper FETs, 642 and 644. The helper FETs 642 and 644 permit the input receiver to operate over a wider range of Vref values, including Vref at or near 0 volts.

A first helper PMOS FET 642 pulls up the logic NMOS FET 614 that has its gate configured to receive the input signal. The gate of the first helper PMOS FET 644 is connected to Vref. The source of the first helper PMOS FET 642 is coupled to Vdd, while the drain of the first helper PMOS FET 642 is coupled to the drain of the logic NMOS FET 614.

The second helper PMOS FET pulls up the Vref or second NMOS FET 630 that has its gate controlled by the Vref value. The gate of the second helper PMOS FET 644 is also connected to Vref. The source of the second helper PMOS FET 644 is coupled to Vdd, while the drain of the second helper PMOS FET 644 is coupled to the drain of the Vref NMOS FET 630.

The helper FETs operate in much the same manner as when configured to support a CMOS logic gate. The PMOS helper FET configuration operates to supply bias current to the NMOS logic gate even under conditions where the Vref value is low or near 0 volts.

Figure 7:
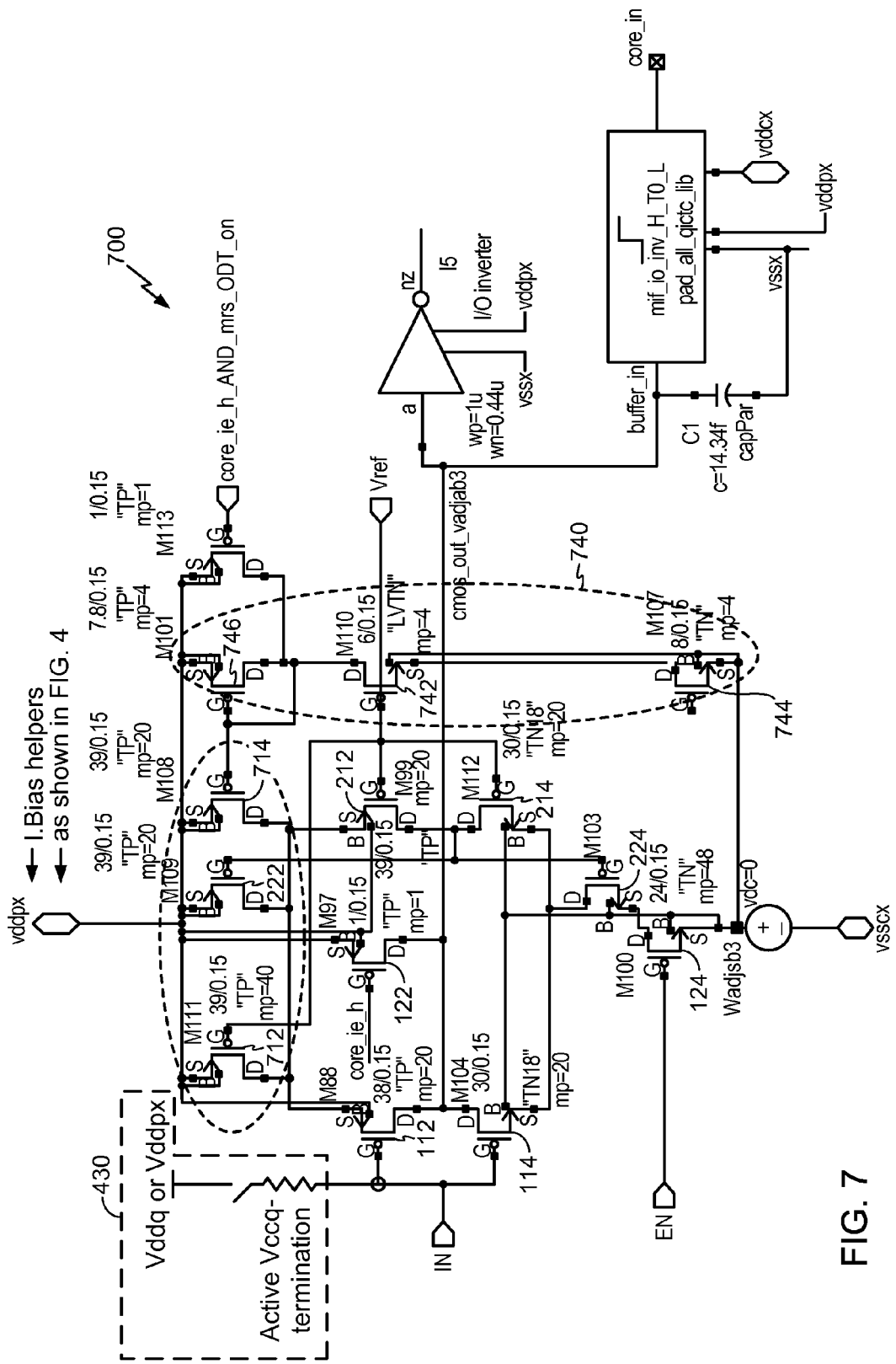
FIG. 7 is a simplified schematic diagram of an exemplary embodiment of a Vref adjustable self biased pseudo-differential receiver.

FIG. 7 is a simplified schematic diagram of an exemplary embodiment of a Vref adjustable self biased CMOS receiver 700. The configuration of the CMOS receiver 700 of FIG. 7 is similar to the configuration of the CMOS receiver of FIG. 4. However, the pseudo-differential receiver 700 of FIG. 7 includes a Vref level detector 740 rather than just a helper NMOS FET configuration as in the exemplary pseudo-differential receiver embodiment of FIG. 4.

The pseudo-differential input receiver 700 of FIG. 7 is based on the CMOS receiver of FIG. 2. A PMOS FET 112 is stacked on an NMOS FET 114, and the two FETs share a common gate connection as the inverter input.

A Vref CMOS pair is positioned substantially in parallel to the CMOS inverter. The Vref CMOS pair includes a PMOS Vref FET 212 stacked on an NMOS Vref FET 214. The PMOS Vref FET 212 and NMOS Vref FET 214 have common gate connections, which are configured to receive the reference voltage, Vref.

The source connection of the PMOS Vref FET 212 is common with the source of the PMOS FET 112 of the CMOS inverter. The common source connections are coupled to the drain of a pull up PMOS FET 222. The source of the pull up PMOS FET 222 is coupled to Vdd, while the gate is coupled to the common drain connections of the Vref CMOS pair.

The source connection of the NMOS Vref FET 214 is common with the source of the NMOS FET 114 of the CMOS inverter. A pull down NMOS FET 224 has a drain connected to the common source connections and has a source connected to Vss or optionally to the drain of the NMOS enable FET 124. The gate of the pull down NMOS FET 224 is coupled to the common drain connection of the Vref CMOS pair.

The pseudo-differential receiver 700 includes a plurality of helper PMOS FETs 712 and 714. A first helper PMOS FET 712 has its gate coupled to Vref, while a second helper PMOS FET 714 has its gate coupled to a signal from the Vref level detector 740. The source of the first helper PMOS FET 712 is coupled to Vdd while the drain of the first helper PMOS FET 712 is coupled to the common source connections of the CMOS logic gate and the Vref CMOS pair.

The source of the second helper PMOS FET 714 is coupled to Vdd. The drain of the second helper PMOS FET 714 is coupled to the common source connections of the CMOS logic gate and the Vref CMOS pair.

The Vref level detector 740 includes an NMOS FET 742 in stacked configuration with an NMOS enable FET 744. The gate of the NMOS FET 742 is configured to receive the Vref value. The source of the NMOS FET 742 is coupled to the drain of the NMOS enable FET 744. The gate of the NMOS enable FET 744 is configured to receive the enable signal, while the source of the NMOS enable FET 744 is coupled to Vss.

The drain of the NMOS FET 742 is coupled to a PMOS pull-up FET 746 having its source coupled to Vdd. The gate of the PMOS pull-up FET 746 is coupled to the drain of the NMOS FET 742. The drain of the NMOS FET 742 is also coupled to the gate of the second helper PMOS FET 714.

The Vref-level detector 740 of the exemplary pseudo-differential receiver 700 embodiment of FIG. 7 enables the CMOS receiver to work more efficiently over a wide range of Vref values than the pseudo-differential receiver configuration of FIG. 4. The Vref-level detector 740 maintains the effectiveness of the bias helper FETs over the entire Vref range to enable the pseudo-differential receiver 700 of FIG. 7 to operate over a Vref range of substantially from Vss to 72% Vdd, which corresponds to approximately 0-0.864 volts for a 1.2V Vdd value.

Figure 8A:
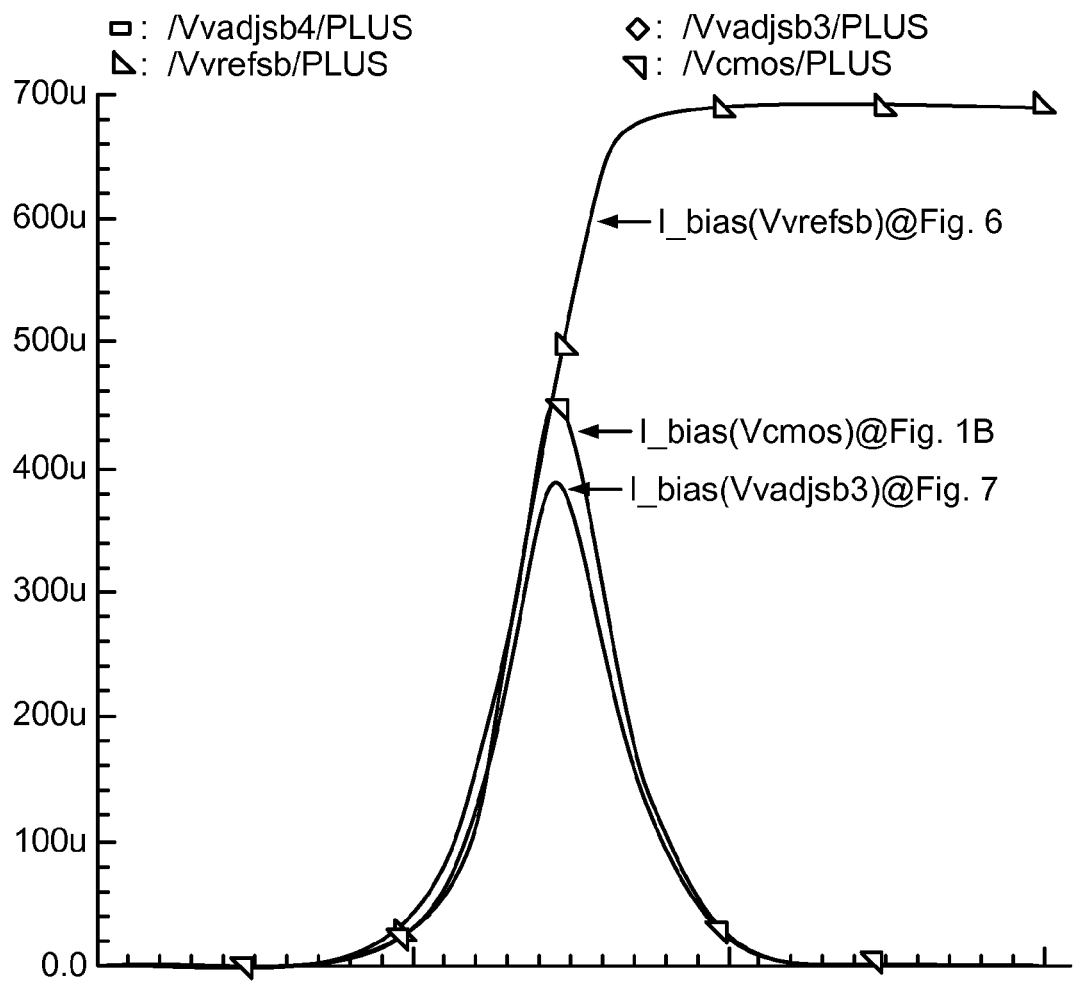
FIGS. 8a-8f are simplified diagrams of performance curves comparing various exemplary receiver embodiments.
Figure 8B:
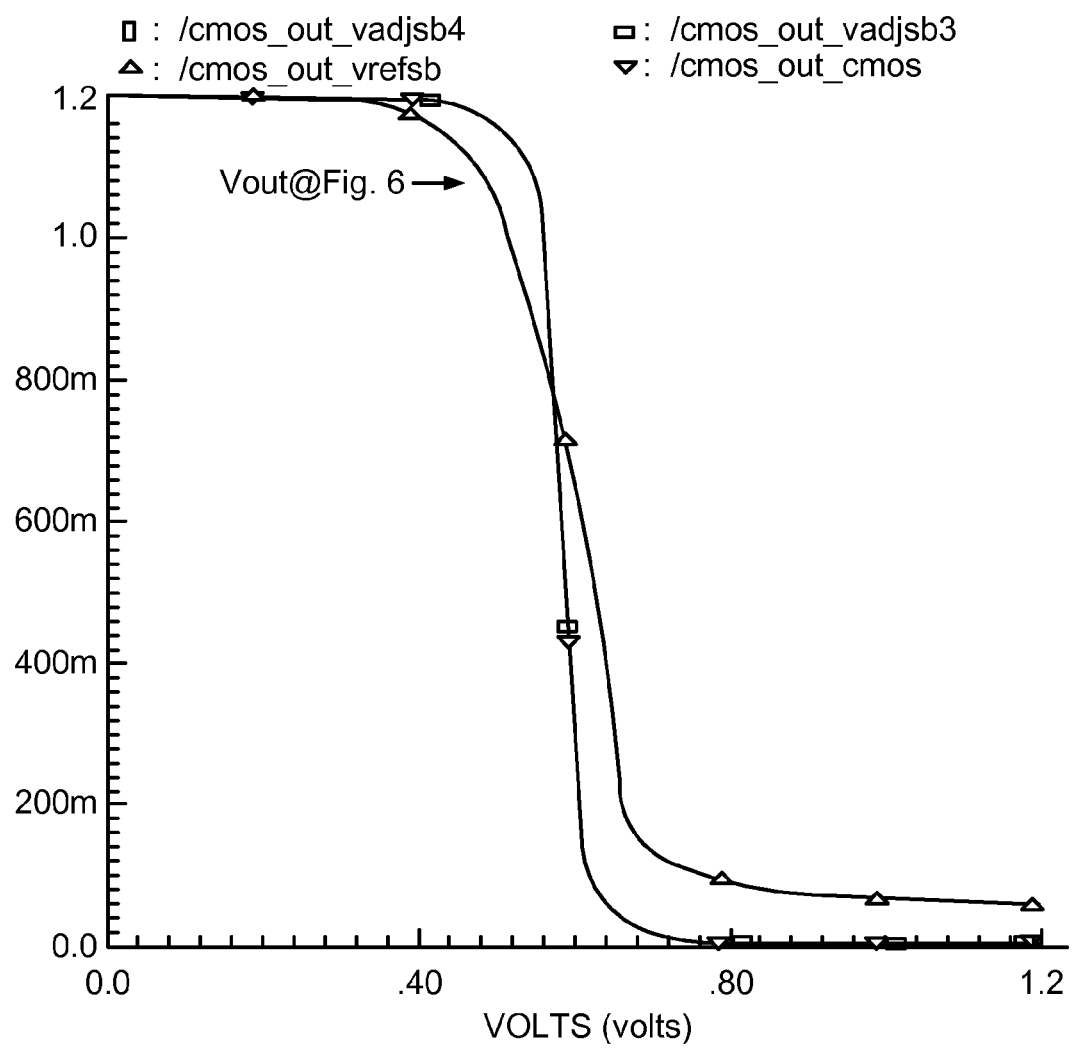

FIGS. 8a-8f are simplified diagrams of performance curves comparing various exemplary receiver embodiments. FIGS. 8a and 8b illustrate, respectively, the bias current with respect to Vin and the voltage transfer function of Vout with respect to Vin for the exemplary input receiver embodiments of FIGS. 1, 4, 6, and 7 when Vref is set to 0V. As can be seen from FIG. 8a, the exemplary NMOS receiver embodiment continues to conduct once the NMOS FET is biased to an ON condition.

Figure 8C:
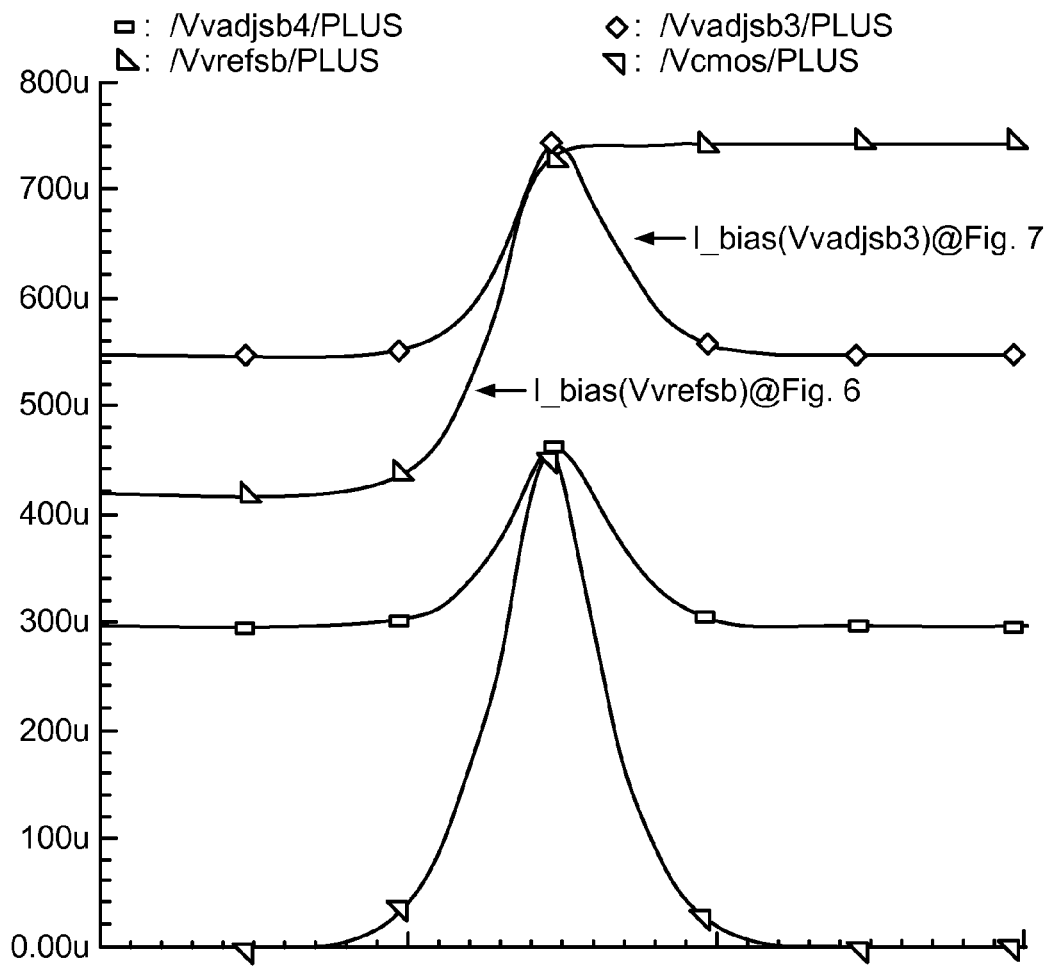
Figure 8D:
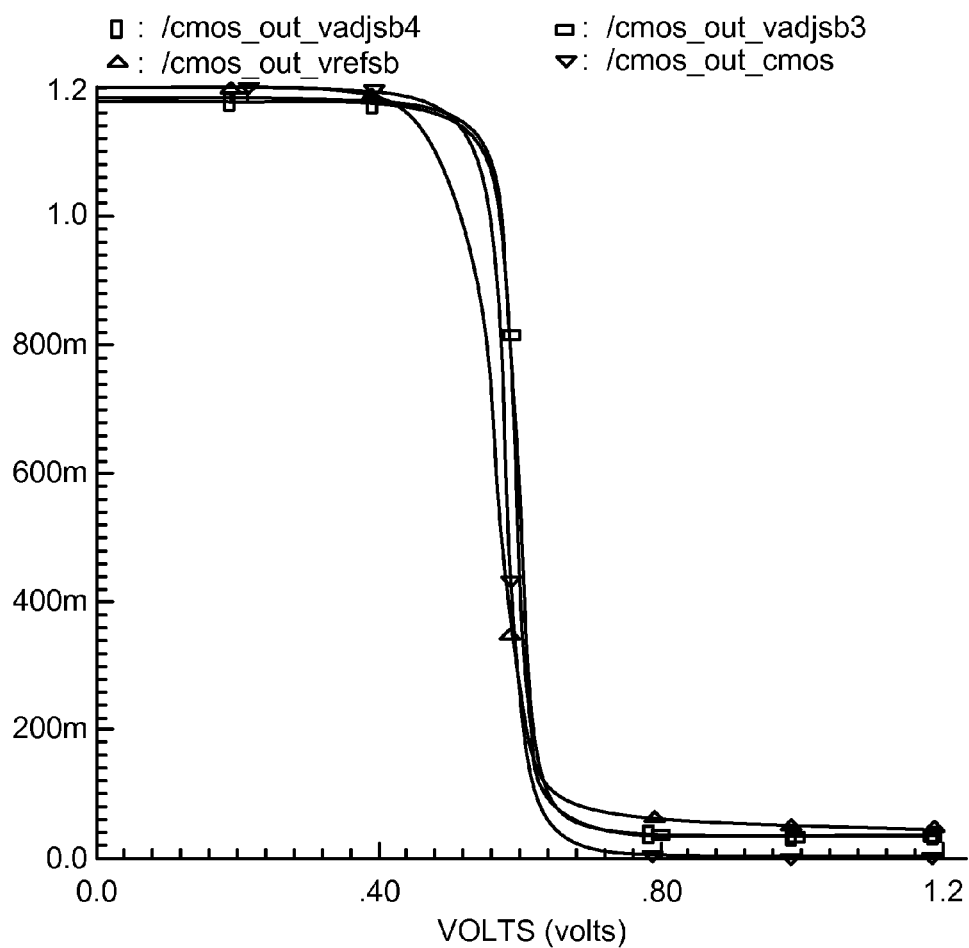

FIGS. 8c and 8d illustrate, respectively, the bias current with respect to Vin and the voltage transfer function of Vout with respect to Vin for the exemplary input receiver embodiments of FIGS. 1, 4, 6, and 7 when Vref is set to approximately one-half the Vdd voltage, which is approximately 0.6V for a Vdd of 1.2V. The exemplary CMOS receiver embodiment of FIG. 1 does not accept a Vref value, and thus its performance remains the same as in FIGS. 8a and 8b.

Figure 8E:
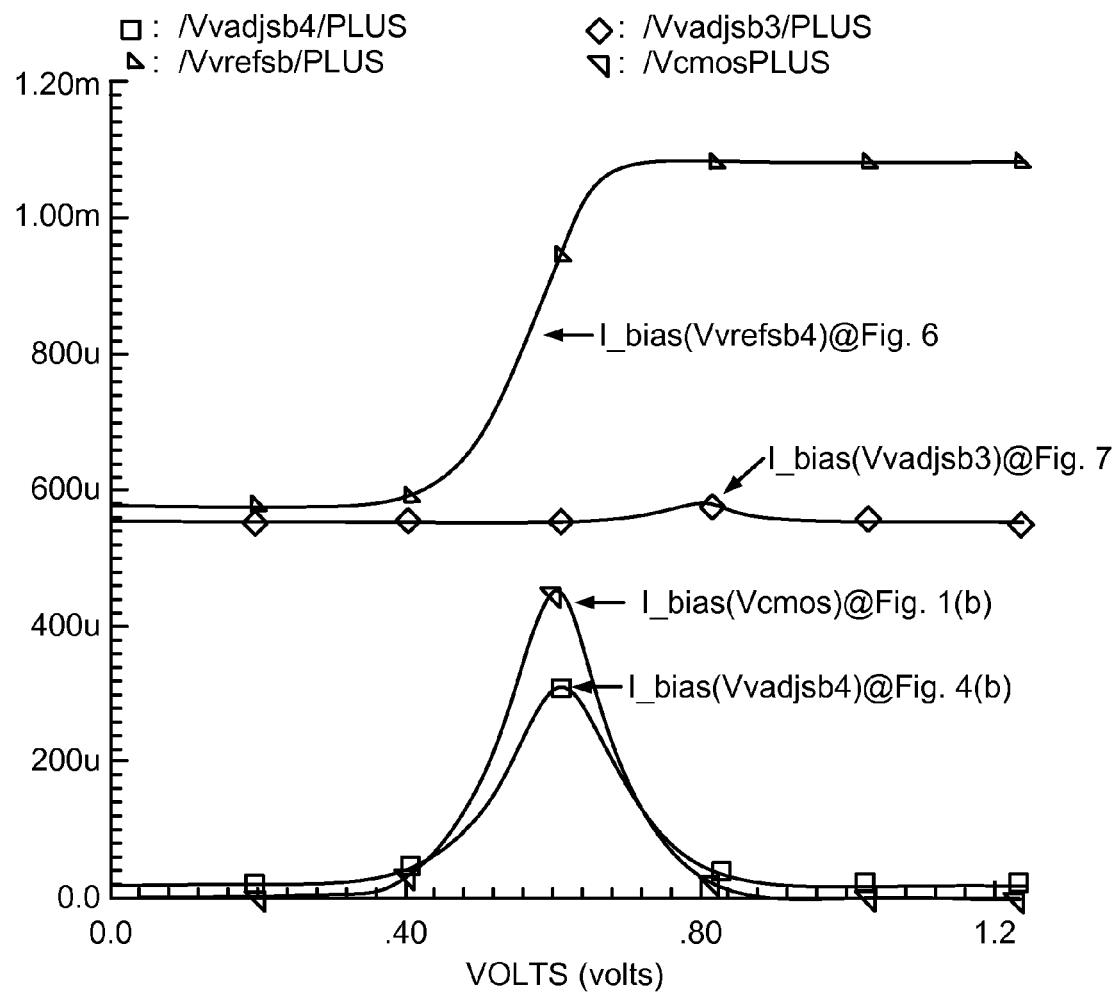
Figure 8F:
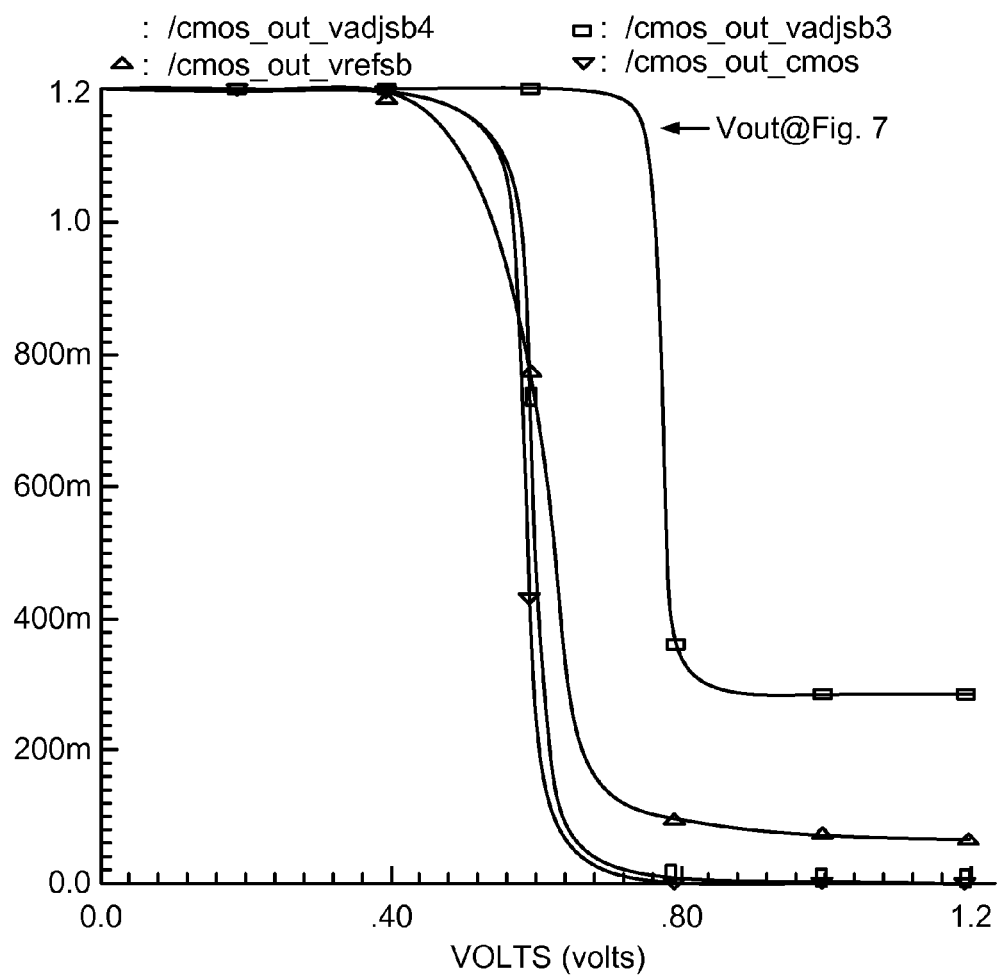

FIGS. 8e and 8f illustrate, respectively, the bias current with respect to Vin and the voltage transfer function of Vout with respect to Vin for the exemplary input receiver embodiments of FIGS. 1, 4, 6, and 7 when Vref is set to a value greater than one-half the Vdd voltage. In the performance curves of FIGS. 8e and 8f, the value of Vref is set to approximately 0.8V.

As can be seen by the performance curves of FIG. 8f, only the Vref-detecting CMOS receiver of FIG. 7 is able to closely track the high Vref level of 0.8V while maintaining an acceptable current level.

Each of the exemplary input receiver embodiments of FIGS. 3-4 and FIGS. 6-7 can be utilized as an input receiver for an interface of an integrated circuit or module. For example, each address or data input to a memory module or memory integrated circuit can be configured with an input receiver as described herein in order to enable operation over a wide range of Vref and frequency values.

Figure 9:
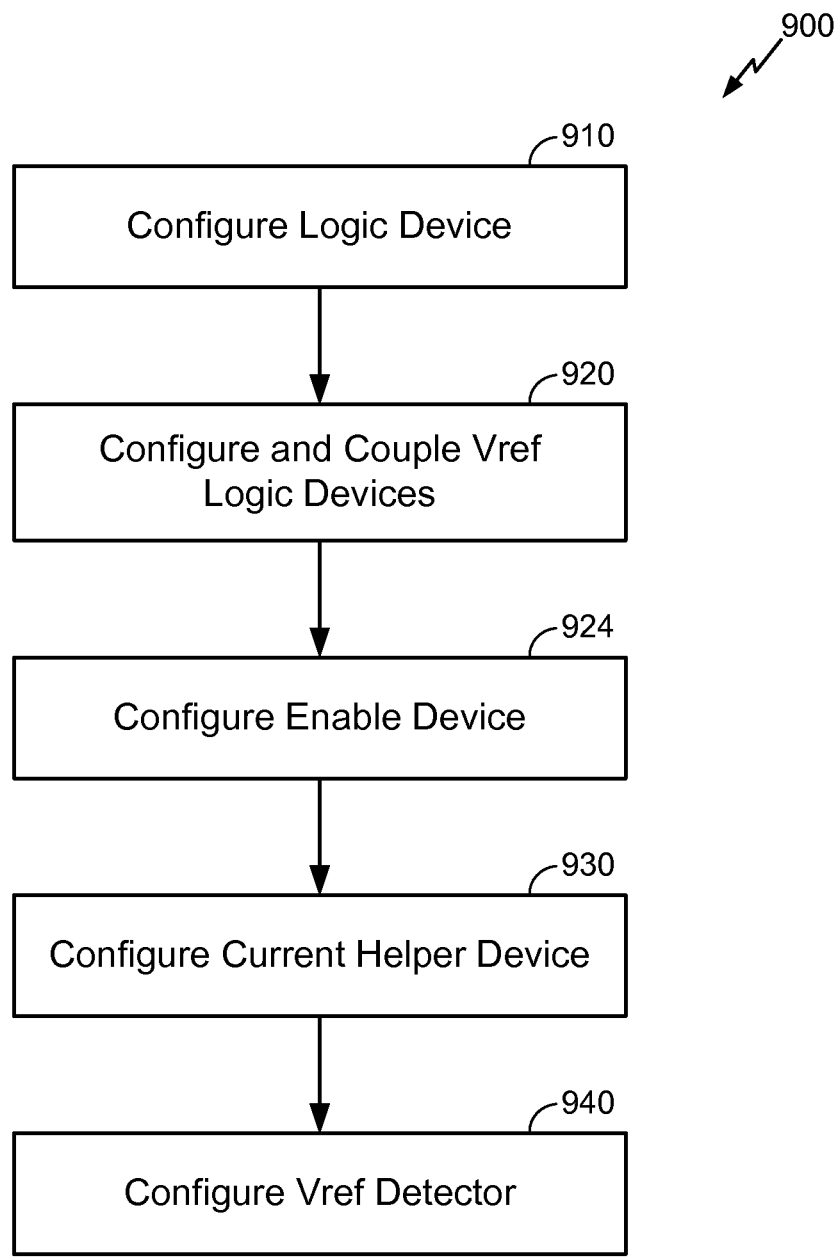
FIG. 9 is a simplified flowchart of an exemplary embodiment of a method of self biasing pseudo-differential receiver.

FIG. 9 is a simplified flowchart of an exemplary embodiment of a method 900 of configuring a self biasing a CMOS receiver. The method 900 can be performed, for example, when manufacturing or designing an integrated circuit having an input receiver described herein or when configuring a module having the input receiver described herein.

The method begins at block 910 where the designer configures a logic device. Most commonly, the designer will configure a CMOS logic inverter, which is the baseline for many logic devices. However, the methods and input receiver exemplary embodiments are not limited to CMOS configurations, and a designer may configure, for example, a NMOS inverter.

The designer proceeds to block 920 and configured Vref logic devices in order to permit support for a varying Vref level. As described above, the Vref level may be set external to an integrated circuit.

The Vref logic device or devices include a Vref device positioned substantially in parallel to the logic device. In the exemplary embodiment, a Vref CMOS pair is positioned substantially in parallel to the CMOS inverter, which is the CMOS logic gate.

The Vref logic devices also include a pull up FET, such as a pull up PMOS FET that has its gate controlled by the common drain connection of the Vref CMOS pair. The Vref logic devices also include a pull down NMOS FET that has its gate controlled by the common drain connection of the Vref CMOS pair. The pull up and pull down FETs control the amount of current that flows through the CMOS logic gate.

The designer proceeds to block 924 and optionally configures one or more enable devices. The enable devices permit the input receiver to be placed in an inactive high impedance or terminated state. The enable devices can also be configured to supply a constant logic state at its output in order to provide a stable logic output and not float to an indeterminate value when not enabled. Although the exemplary embodiments illustrated herein implement an active high enable signal, the enable devices may be implemented to operate using an active high or active low enable signal.

After configuring the enable devices, if any, the designer proceeds to block 930 and configures one or more helper devices. As shown in the exemplary embodiments of FIGS. 3-4 and 6-7, the helper devices can include one or more PMOS helpers as well as one or more NMOS helpers.

Each PMOS helper can be positioned substantially in parallel to the pull up PMOS FETs and can have a gate controlled by the Vref value and can operate to pull up the logic output.

Each NMOS helper can be positioned substantially in parallel to an NMOS pull down FET and can have a gate coupled to the Vref value.

The designer proceeds to block 940 and optionally configures a Vref detector that can also operate as a bias current amplifier. As illustrated in the exemplary embodiment of FIG. 7, the Vref detector can include an NMOS gate driven by the Vref value. The drain of the NMOS gate is coupled to a PMOS pull-up FET. The drain of the NMOS gate is also coupled to the gate of a helper PMOS FET that is distinct from other helper PMOS FETs that may be driven by the Vref value.

The use of helper FETs enable the input receiver to operate over a wider range of Vref values. A pull up helper PMOS FET permits current to flow in the logic device when the Vref value is low, such as when it is near or at 0 volts. The pull down helper FETs assist in pulling down the low output logic level when the Vref value is higher than is conventionally used.

Apparatus and methods for implementing an input receiver that is capable of operating over a large range of Vref values and over a wide range of frequencies is described herein. The wide range Vref enabled input receiver permits a single input receiver to be used in contrast to conventional teachings of having several parallel configurations of input receivers, each optimized for a particular range of Vref and frequency of operation.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A variable range logic threshold enabled input receiver apparatus, the apparatus comprising:
 a logic device;
 a logic threshold configuration coupled in parallel to the logic device and configured to receive a variable logic threshold value and configure the logic device for the logic threshold value; and a helper device configured to receive the variable logic threshold value and configured to provide a bias current path from a power supply to the logic device distinct from a bias current path provided from the power supply to the logic device by the logic threshold configuration.

2. The apparatus of claim 1, further comprising a logic threshold detector configured to receive the logic threshold value and provide an additional bias current path to the logic device based on the variable logic threshold value.

3. The apparatus of claim 2, wherein the logic threshold detector comprises:
an NMOS FET having a gate configured to receive the logic threshold value;
a PMOS pull up FET having a gate common to a drain and a source coupled to a voltage supply source, and wherein the drain is coupled to a drain of the NMOS FET.

4. The apparatus of claim 1, further comprising an enable device configured to receive an enable control signal and configured to selectively inhibit flow of bias current through the logic device based on a state of the enable control signal.

5. The apparatus of claim 1, wherein the logic device comprises a CMOS inverter.

6. The apparatus of claim 5, wherein the logic threshold configuration comprises:
a Vref CMOS pair having a Vref PMOS source common to a PMOS source of the CMOS inverter;
a Vref NMOS source common to an NMOS source of the CMOS inverter;
a PMOS pull up FET having a gate coupled to a common drain of the Vref CMOS pair and coupled to pull up the common PMOS source connection; and
a CMOS pull down FET having a gate coupled to the common drain of the Vref CMOS pair and coupled to pull down the common NMOS source connection.

7. The apparatus of claim 5, wherein the helper device comprises a helper PMOS FET having a gate coupled to the logic threshold value and configured to pull up a source connection of a PMOS FET of the CMOS pair.

8. The apparatus of claim 5, wherein the helper device comprises a helper NMOS FET having a gate coupled to the logic threshold value and configured to pull down a source connection of a NMOS FET of the CMOS pair.

9. The apparatus of claim 5, further comprising a logic threshold detector configured to receive the logic threshold value and provide an additional bias current path to the logic device based on a value of the logic threshold value.

10. The apparatus of claim 1, wherein the logic device comprises an NMOS inverter.

11. The apparatus of claim 10, wherein the logic threshold configuration comprises:
a Vref NMOS FET having a gate configured to receive the logic threshold value, and having a source common to a source of the NMOS inverter;
a first PMOS pull up FET with a source coupled to Vdd, and a drain coupled to the drain of the NMOS inverter;
a second PMOS pull up FET with a source coupled to Vdd, with a drain connection coupled to a drain of the Vref NMOS FET.

12. The apparatus of claim 11, wherein the first PMOS pull up FET has a gate coupled to a drain of the Vref NMOS FET.

13. The apparatus of claim 11, wherein the first PMOS pull up FET has a gate coupled to a drain of the NMOS inverter.

14. The apparatus of claim 11, wherein the second PMOS pull up FET has a gate coupled to the drain of the Vref NMOS FET.

15. The apparatus of claim 11, wherein the second PMOS pull up FET has a gate coupled to a drain of the NMOS inverter.

16. An integrated circuit having the variable range logic threshold enabled input receiver apparatus of claim 1.

17. A variable range logic threshold enabled input receiver apparatus, the apparatus comprising:
a CMOS inverter;
a Vref CMOS pair, including:
a Vref PMOS FET having a source common to a PMOS source of the CMOS inverter; and
a Vref NMOS FET having a drain common to a drain of the Vref PMOS FET, a source common to a source of a NMOS source of the CMOS inverter and configured to receive a logic threshold value;
a PMOS pull up FET having a gate coupled to a common source of the Vref CMOS pair to form a common source connection and coupled to pull up the Vref CMOS pair;
an NMOS pull down FET having a gate coupled to the common drain of the Vref CMOS pair and coupled to pull down the common NMOS source connection; and
a helper PMOS FET having a gate configured to receive the logic threshold value and configured to pull up the common source connection.

18. The apparatus of claim 17, further comprising an enable device configured to receive an enable control signal and configured to selectively inhibit flow of bias current through the CMOS inverter based on a state of the enable control signal.

19. The apparatus of claim 17, further comprising a logic threshold detector configured to receive the logic threshold value and provide an additional bias current path to the CMOS inverter based on the logic threshold value.

20. The apparatus of claim 19, wherein the logic threshold detector comprises:
an NMOS FET having a gate configured to receive the logic threshold value and a source coupled to a ground;
a PMOS pull up FET having a gate common to a drain and a source coupled to a voltage supply source, and wherein the drain is coupled to a drain of the NMOS FET;
a helper PMOS FET having a source coupled to the voltage supply source, a drain coupled to pull up the Vref CMOS pair, and a gate coupled to the drain of the NMOS FET.

21. An integrated circuit having the variable range logic threshold enabled input receiver apparatus of claim 20.

22. A method of configuring a self biasing logic input receiver, the method comprising:
configuring a logic device;
configuring logic threshold devices coupled in parallel to the logic device and to receive a variable logic threshold value and configure the logic device for the logic threshold value; and
configuring a helper device to receive the variable logic threshold value and configured to provide a bias current path from a power supply to the logic device distinct from a bias current path provided from the power supply to the logic device by the logic threshold devices.

23. The method of claim 22, further comprising configuring a logic threshold detector to receive the logic threshold value and provide an additional bias current path to the logic device based on a value of the logic threshold value.

24. The method of claim 22, wherein configuring the logic device comprises configuring a CMOS inverter.

25. The method of claim 24, wherein configuring logic threshold devices comprises configuring a Vref CMOS pair substantially in parallel to the CMOS inverter.

26. The method of claim 24, wherein configuring the helper device comprises configuring a helper PMOS FET having a gate coupled to the logic threshold value and configured to pull up a source connection of a PMOS FET of the CMOS inverter.

27. A variable range logic threshold enabled input receiver apparatus, the apparatus comprising:
- a CMOS inverter;
- means coupled in parallel to the CMOS inverter and for receiving a variable logic threshold value and configuring the CMOS inverter for the logic threshold value; and
- means for receiving the variable logic threshold value and providing a bias current path from a power supply to the CMOS inverter distinct from a bias current path provided from the power supply to the CMOS inverter by the means for receiving a variable logic threshold value.

28. The apparatus of claim 27, further comprising means for receiving the logic threshold value and providing an additional bias current path to the CMOS inverter based on the variable logic threshold value.

\* \* \* \* \*